(12) United States Patent
Hüttinger et al.

(10) Patent No.: US 8,803,540 B2
(45) Date of Patent: Aug. 12, 2014

(54) GALVANICALLY ISOLATED FUNCTIONAL TEST FOR COMPONENTS

(75) Inventors: Simon Hüttinger, Erlangen (DE); Thomas Komma, Ottobrunn (DE); Kai Kriegel, München (DE); Jürgen Rackles, Puchheim (DE); Gernot Spiegelberg, Bad Abbach (DE)

(73) Assignee: Siemens Aktiengesellschaft, Munich (DE)

( * ) Notice: Subject to any disclaimer, the term of this patent is extended or adjusted under 35 U.S.C. 154(b) by 248 days.

(21) Appl. No.: 13/138,329

(22) PCT Filed: Jan. 13, 2010

(86) PCT No.: PCT/EP2010/050347
§ 371 (c)(1),
(2), (4) Date: Aug. 2, 2011

(87) PCT Pub. No.: WO2010/086226
PCT Pub. Date: Aug. 5, 2010

(65) Prior Publication Data
US 2011/0291672 A1      Dec. 1, 2011

(30) Foreign Application Priority Data
Feb. 2, 2009   (DE) .................... 10 2009 006 970

(51) Int. Cl.
*G01R 27/28* (2006.01)
*G01R 31/26* (2014.01)
*G01R 31/27* (2006.01)
*G01R 31/327* (2006.01)

(52) U.S. Cl.
CPC .............. *G01R 31/26* (2013.01); *G01R 31/27* (2013.01); *G01R 31/327* (2013.01)

USPC ................. 324/756.06; 324/750.01; 324/649

(58) Field of Classification Search
CPC ....... G01R 31/26; G01R 31/27; G01R 31/327
USPC ................... 324/525, 600, 674, 681, 756.06, 324/649–652, 762.01–762.03, 324/762.07–762.09
See application file for complete search history.

(56) References Cited

U.S. PATENT DOCUMENTS 4,113,998 A * 9/1978 Ashdown et al. .......... 379/29.03
4,242,631 A * 12/1980 Hall .............................. 324/649

(Continued)

FOREIGN PATENT DOCUMENTS

DE            32 21 176         12/1982
DE   10 2009 006 970.4          2/2009

(Continued)

OTHER PUBLICATIONS

International Search Report for PCT/EP2010/050347, mailed on May 26, 2010.

*Primary Examiner* — Arleen M Vazquez
*Assistant Examiner* — Robert P Alejnikov, Jr.
(74) *Attorney, Agent, or Firm* — Staas & Halsey LLP

(57) ABSTRACT

A method and a circuit functionally test a semiconductor component. The functional test is performed with galvanic isolation by using a transformer. The test itself is based on determining the frequency-dependent impedance of a series circuit of capacitors and inductors using the semiconductor component itself. The impedance is strongly influenced by the conduction state of the semiconductor component, in other words, by the instantaneous conductivity or blocking capability of the semiconductor component.

10 Claims, 3 Drawing Sheets

(56) References Cited

U.S. PATENT DOCUMENTS

| | | | |
|---|---|---|---|
| 4,535,959 A * | 8/1985 | Gilcher | 246/34 R |
| 4,973,912 A | 11/1990 | Kaminski et al. | |
| 5,969,432 A | 10/1999 | Zabler et al. | |
| 6,342,791 B1 | 1/2002 | Ichikawa et al. | |
| 6,855,239 B1 * | 2/2005 | Jairath | 205/80 |
| 7,285,930 B2 * | 10/2007 | Weinmann et al. | 318/400.31 |
| 7,339,803 B2 * | 3/2008 | Nojima | 363/37 |
| 7,626,838 B2 * | 12/2009 | Gunji | 363/56.04 |
| 8,432,066 B2 * | 4/2013 | Takada et al. | 307/104 |
| 2008/0012580 A1 * | 1/2008 | Funo et al. | 324/663 |
| 2013/0094107 A1 * | 4/2013 | Setiadi et al. | 360/234.3 |

FOREIGN PATENT DOCUMENTS

| | | |
|---|---|---|
| EP | 1 083 658 | 3/2001 |
| EP | 1 214 913 | 6/2002 |
| EP | PCT/EP2010/050347 | 1/2010 |
| EP | 2 177 921 | 4/2010 |
| FR | 2 701 176 | 8/1994 |
| GB | 2 013 904 | 8/1979 |
| WO | 2004/032088 | 4/2004 |

* cited by examiner

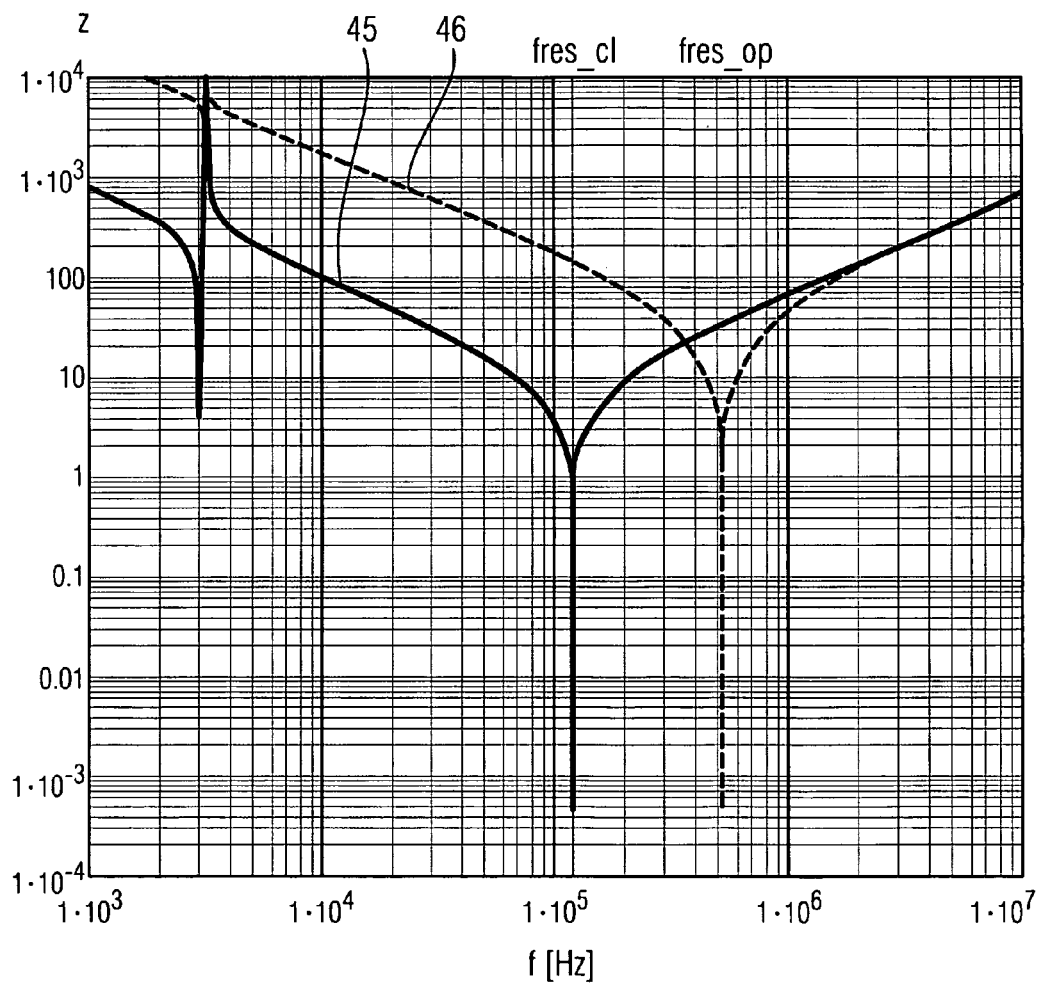

GALVANICALLY ISOLATED FUNCTIONAL TEST FOR COMPONENTS

CROSS REFERENCE TO RELATED APPLICATIONS

This application is based on and hereby claims priority to International Application No. PCT/EP2010/050347 filed on Jan. 13, 2010 and German Application No. 10 2009 006 970.4 filed on Feb. 2, 2009, the contents of which are hereby incorporated by reference.

BACKGROUND

The invention relates to a method for functional testing and to a functional test circuit.

Permanent-magnet synchronous machines (PSM) are used, for example, for the drive in electric cars. As in other applications as well, they are used there in the weak-field mode, that is to say the magnetic field is reduced by a field-weakening current. This allows higher rotation speeds to be achieved. In an electric car, a DC battery and a converter between the battery and PSM, for conversion of the single-phase battery voltage to the three-phase motor supply, is also provided by way of example as a drive system for the operation of the PSM.

If the upstream converter fails at high rotation speeds of the PSM, the field-weakening current in consequence fails. As long as the rotation speed remains high, that is to say at least for a short time, the magnets in the motor induce a voltage which is above the normal and desired intermediate-circuit voltage or battery voltage. However, an excessively high voltage is destructive to modern batteries.

One possible design for protection of the battery is to provide one or more diodes between the converter and the battery, and one or more semiconductor switches in parallel with the diode or diodes. In this case, it is highly advantageous for it to be possible to switch the semiconductor switch off at all times.

One possible way to ensure increased reliability is to use redundant semiconductor switches. However, the electrical power loss, which is lost in the semiconductor switches, increases corresponding to the number of additional semiconductor switches used. One possible way to avoid this disadvantage is to test whether the semiconductor switch is functional.

SUMMARY

One potential object is to specify a functional test circuit by which the functionality of a component can be determined in a simple manner.

The inventors propose a method for functional testing for a component, the component is connected to an electrical test circuit, with the test circuit having a transformer. It is self-evident that it is expedient to make the connection once, and therefore to electrically firmly connect the test circuit to the component to be tested. The test circuit is then a permanent component of an electronic layout, in which the component is also provided. However, it is also possible to make the connection only when the intention is to carry out a test.

Furthermore, an AC voltage is produced in the test circuit. On the basis of the normal rules relating to this, this AC voltage propagates in the test circuit and into the component. The amplitude of the AC voltage at various points within the test circuit depends on the specific configuration of the test circuit, the dimensions of the components, the frequency of the AC voltage and the conductivity state of the component.

In this case, by way of example, the conductivity state of the component may be the state in which the component is conducting. In the case of a semiconductor switch such as an IGBT, this means that it is switched on and only a residual voltage is dropped across the IGBT. The output capacitance of the IGBT, which influences the frequency-dependent impedance for the AC voltage, is then shorted.

In the case of a semiconductor switch such as the IGBT, there is also the further conductivity state of blocking, for which the IGBT is switched off. In this case, the output capacitance of the IGBT is not shorted and also influences the frequency-dependent impedance for the AC voltage.

A further example for a conductivity state is a diode being forward-biased or reverse-biased. In this case, the conductivity state is normally not influenced by any control, but occurs only as a result of the voltage difference which exists across the diode. Nevertheless, the conductivity state can be determined by its influence on the frequency-dependent impedance of the test circuit and diode.

As already described on the basis of the examples, the conductivity state of the component is determined from the joint impedance of the test circuit and the component for the AC voltage.

The inventors also propose a test circuit for functional testing for a component has a transformer for this purpose. Furthermore, at least one feed circuit is provided in order to produce an AC voltage at a definable frequency. Finally, at least one measurement circuit is provided for determining the impedance of the test circuit and the component at that frequency.

The advantage of the method and of the test circuit is that both allow the conductivity state of the component to be tested free of potential. It is particularly advantageous for a high voltage to be applied to the component at times. This can be the situation, for example, in electric cars, in which the intermediate-circuit voltages between the battery and the converter may be 600 V or more. In situations such as this, the conductivity state can be determined and an appropriate signal can be passed on electrically to, for example, a microprocessor at a voltage level close to ground. This considerably improves the safety of the layout for human actions.

In this case, it is expedient to design the test circuit such that the measurement circuit is arranged on the primary side of the transformer, while the component is connected to the secondary side. This is because the measurement circuit is then arranged to be galvanically isolated from the component, avoiding any other form of galvanic isolation, for example in an optical form.

In order to determine the joint impedance of the test circuit and the component for the AC voltage, a conductivity state of the component to be tested is preferably selected, and a frequency which is matched to the conductivity state to be tested is selected for the AC voltage. By way of example, the conductivity state is the state of the electrical line, for example as is the case in the switched-on state of a semiconductor switch. A further example for this conductivity state is a diode, with the voltages on both sides of the diode being such that the diode is forward-biased. One example of another conductivity state is a blocking state, which occurs when semiconductor switches are switched off or in the case of diodes when the voltages on both sides of the diode are appropriately set.

There is a large amount of freedom for the selection of the frequency. In principle, the conductivity state of the component influences the frequency-dependent joint impedance of the test circuit and the component for the AC voltage. In a conductive state, a component will therefore add only a small capacitance to the impedance, since the natural capacitance of the component is shorted by the component itself. In this case, the component contributes a largely resistive element to the impedance. The opposite situation occurs in the blocking state. Here, the component will contribute a largely capacitive, or else possibly inductive, element to the impedance. Therefore, if the component is not in the conductivity state to be tested, the joint impedance will virtually always be different than in the conductivity state to be tested.

However, it is particularly advantageous for the frequency to be selected such that the impedance is virtually zero in the conductivity state to be tested. This results in a particularly clear signal, and even minor discrepancies in the component from its conventional behavior can be detected.

In order to obtain an impedance tending to zero, it is expedient for the test circuit to also have at least one series capacitor and one series inductance, in addition to the transformer. These are preferably connected in series with one another, and with the transformer. This configuration of the test circuit advantageously results in the presence of a resonant frequency, at which the impedance is virtually zero. The resonant frequency in this case depends, inter alia, on the impedance of the component, that is to say on its conductivity state. The resonant frequency for the conductivity state to be tested is advantageously selected as the frequency for the AC voltage.

The test circuit and the test method are particularly suitable for switchable components such as semiconductor switches, for example MOSFETs or IGBTs. The test circuit and the test method are likewise also suitable for components such as diodes which, although they cannot be controlled directly, can change their conductivity state in some other way, however. Components such as these have at least two different conductivity states. In principle, it is also possible for the test circuit and the test method to be applied to a group of individual components. For example, it is also possible to test a parallel circuit comprising an IGBT and a diode. In this case, all the components which are present influence the joint impedance.

In this case, the use of the test circuit and of the test method are in no way restricted to the initially described field of electrical vehicles. In fact, the method can be used universally.

Both conductivity states can be tested using an AC voltage by evaluating the respective resultant impedances for both conductivity states. In this case, the frequency of the AC voltage can be matched to one of the two conductivity states, by selecting the appropriate resonant frequency. The impedance in this conductivity state will then be zero or virtually zero, and will assume a different value in the other conductivity state. In this case, the test circuit expediently comprises only a device for production of the AC voltage, and the configuration is therefore as simple as possible.

It is likewise possible to match the frequency of the AC voltage to the respective currently present conductivity state to be tested, for example by always selecting the appropriate resonant frequency for the test. This always allows a very accurate measurement. In this case as well, the test circuit expediently also comprises only a device for production of the AC voltage, but the device is designed such that the frequency can be changed.

A third alternative is to produce two or possibly more AC voltages. For this purpose, the test circuit comprises preferably two or more devices for production of an AC voltage. The frequencies can then advantageously be matched to in each case one of the conductivity states to be tested, that is to say for example the respective resonant frequency can be selected. There is no need to switch the frequency in the device for production of the AC voltage.

The impedance is determined by the at least one measurement circuit which is provided in the test circuit. The measurement circuit preferably has a frequency filter, in particular a high-pass or low-pass filter, in order to separate the signal of the AC voltage from other signals. This is particularly advantageous when a plurality of AC voltages at a different frequency are produced at the same time. In order to obtain a voltage signal which corresponds essentially to the impedance in the measurement circuit, it is expedient for the measurement circuit to be linked to a point in the test circuit which corresponds to the center point of a voltage divider. In this case, an output resistance of the feed circuit is one resistance of the voltage divider, and the further elements of the test circuit, that is to say the transformer and the component and possibly further elements such as a series capacitor and series inductance, are the other resistance of the voltage divider.

One possible scenario for use of the test circuit is a converter circuit for overvoltage protection, having:
  a converter for conversion of a single-phase voltage to a three-phase voltage,
  a diode, which is provided on the single-phase side of the converter,
  a semiconductor switch, which is connected in parallel with the diode,
  a single-phase battery, which is connected to the single-phase input side of the converter circuit, and
  a test circuit for the diode and the semiconductor switch mentioned above.

By way of example, a converter circuit such as this is used in electrical vehicles such as electric cars. An IGBT is preferably used as a semiconductor switch. Nowadays, IGBTs with parallel diodes are typically already available as complete components. Alternatively, a MOSFET is used as a semiconductor switch. By virtue of its design, this already contains a diode. When using a MOSFET there is therefore expediently no longer any need for a separate diode, since the diode is part of the MOSFET.

The diode is in this case expediently fitted in the input line to the converter for the positive voltage, that is to say the phase connection to the single-phase side of the converter. Furthermore, it is preferably fitted such that it allows current to flow into the converter, and blocks a positive voltage from the converter side.

The converter circuit protects an appliance which is connected to the single-phase side, for example a motor-vehicle battery, against overcharging, by the diode. However, at the same time, the semiconductor switch which is arranged in parallel allows the diode to be bridged, that is to say, for example, allows feedback from the direction of the converter into the battery.

The converter circuit can advantageously be used in a drive system. In addition to the converter circuit, this has at least one electric motor which, for example, is a permanent-magnet synchronous machine which is designed in particular for the weak-field mode. The electric motor is expediently connected to the three-phase output side of the converter circuit. Furthermore, at least one single-phase battery is provided. This is connected to the single-phase input side of the converter circuit. In this case, it is expedient for protection of the battery against overvoltage for the positive battery connection to be connected to the converter circuit via the diode. By way of example, a drive system such as this can be used in an electrical vehicle such as an electric car.

The drive system preferably has an apparatus for determining a value which represents the voltage on the single-phase input side of the converter. By way of example, the apparatus could include a device for voltage measurement across an intermediate-circuit capacitor provided in the area of the converter.

In one advantageous operating method for the drive system, the electric motor is fed from the battery in a motor operating state. Therefore, in this step, the motor is expediently driven, corresponding to "acceleration". In a further state, the feedback operating state, the battery is fed from the electric motor. In the case of an electrical vehicle, this state is typically assumed during braking. During braking, an attempt is made to recover as much energy as possible from the movement of the vehicle again, and to store this in the battery. In this case, the semiconductor switch is switched on in the feedback operating state. This means that, when the aim is for feedback to occur, the diode which is otherwise reverse-biased for feedback in the converter circuit is bridged by the semiconductor switch. Finally, the semiconductor switch is turned off in the event of a defect in the converter. In conjunction with the reverse-biased diode, this in turn prevents the battery from being overcharged.

There are various possible ways to detect a defect in the converter. Since the present method relates primarily to avoiding an overvoltage for the battery, a value which represents the voltage on the single-phase input side of the converter is preferably determined and, if this value at least reaches a threshold value, a defect in the converter is detected and the semiconductor switch is therefore expediently turned off, if it was previously switched on. By way of example, the voltage across an intermediate-circuit capacitor, which is provided on the single-phase side of the converter, is measured for this purpose.

If the semiconductor switch is switched on when a defect occurs in the converter, then the diode prevents the overvoltage from being passed on to the battery, without any further action. This prevents the semiconductor switch from being switched on during a braking process, for example.

It is advantageous for the converter itself to be designed such that it withstands the voltages which can occur in the absence of the field-weakening current. No separate protection is then required for the converter itself.

The test circuit is in turn used in order to make it possible to determine at any time whether the semiconductor switch and the diode have also actually assumed their desired or expected conductivity state. In this case, in order to test the capability of the diode to conduct, the battery voltage must be greater than the intermediate-circuit voltage. This is the case in the motor operating state, that is to say during acceleration. In order to test the blocking capability, the intermediate-circuit voltage must be greater than the battery voltage. This case occurs during feedback from the electric motor into the battery. The semiconductor switch and the diode then receive the difference voltage between the intermediate-circuit voltage and the battery voltage. The switching capability of the semiconductor switch can then be tested, for example, by actively switching the semiconductor switch on. It is particularly advantageous to briefly switch the converter to the feedback state in the motor operating state, that is to say during "acceleration". The operation of the semiconductor switch is then tested during the brief switching time. The switching time is in this case preferably designed to be sufficiently short that it does not lead to any significant deceleration of the electrical vehicle.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 4 shows the behavior of the impedance of the test circuit as a function of the frequency.

DETAILED DESCRIPTION OF THE PREFERRED EMBODIMENT

Figure 1:
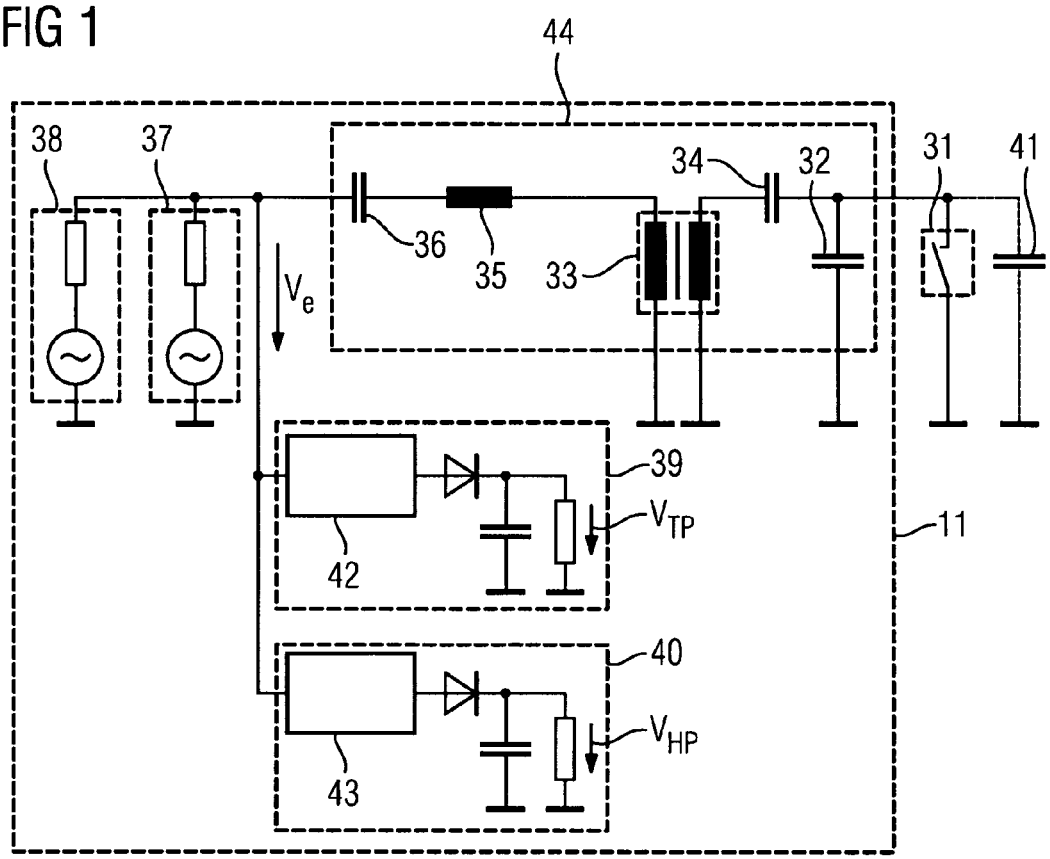
FIG. 1 shows a test circuit.

Reference will now be made in detail to the preferred embodiments of the present invention, examples of which are illustrated in the accompanying drawings, wherein like reference numerals refer to like elements throughout.

FIG. 1 schematically illustrates the configuration of an example of a test circuit 11 for a semiconductor switch 31. The semiconductor switch 31 may be of any desired type, and is therefore illustrated only as a simple switch in FIG. 1. The voltage-dependent output capacitance of the semiconductor switch 31 is in this case represented by an additional capacitor 41.

The test circuit 11 itself now has an additional capacitor 32 which is provided in parallel with the semiconductor switch 31. This additional capacitor 32 is used to increase the voltage-dependent output capacitance of the semiconductor switch 31, and thus to make it independent of the voltage. The additional capacitor 32 is then followed by a series circuit 44 which has, in series, a first series capacitor 34, a transformer 33, a series inductance 35 and a second series capacitor 36. The series circuit 44 is followed by a first and a second AC voltage source 37, 38, which are linked to one another in parallel and are linked to the series circuit 44. Furthermore, a first and a second measurement point 39, 40 are connected to the end of the series circuit 44.

Together with the semiconductor switch 31, the components of the series circuit 44 form a frequency-dependent impedance. The behavior of this impedance is evaluated in order to identify whether the switching state of the semiconductor switch 31 corresponds to the desired switching state which—depending on the nature of the semiconductor switch 31—is determined, for example, via the voltage which is applied to its gate.

In order to explain the procedure, reference will be made to FIG. 4. FIG. 4 shows the profile of the total impedance of the series circuit 44 and the semiconductor switch 31 as a function of the frequency. In this case, a first profile 45, which has an impedance minimum at a first test frequency, corresponds to the behavior when the semiconductor switch 31 is closed. A second profile 46, which has an impedance minimum at a second test frequency, in contrast corresponds to the behavior when the semiconductor switch 31 is open. Since the output capacitance of the switch is shorted when the switch is closed, the first test frequency is lower than the second test frequency.

The first AC voltage source 37 is now operated such that it produces an AC voltage whose frequency is the first test frequency. The second AC voltage source 38 is operated such that it produces an AC voltage whose frequency is the second test frequency. The AC voltage sources 37, 38 may in this case be operated at the same time, alternately, continuously, or only at specific test times.

In conjunction with the switch position of the semiconductor switch 31 and resistors which are integrated in the AC voltage sources 37, 38, the frequency-dependent impedance of the series circuit 44 and of the semiconductor switch 31 results in a level for each of the two AC voltages, which in this exemplary embodiment is measured on that side of the series circuit 44 which faces the AC voltage sources 37, 38.

For this purpose, the first measurement point 38 has a low-pass filter 42 which is tuned to the first test frequency used. The low-pass filter 42 is followed by a diode, and a capacitor and a resistor connected in parallel with one another. A signal which corresponds to the impedance of the series circuit 44 and of the semiconductor switch 31 at the first test frequency can be tapped off across the resistor. As can be seen from FIG. 4, when the switch is open, this value will have a value which is dependent on specific characteristics of the individual components and the voltage across the semiconductor switch 31. However, when the switch is closed, the value will be virtually zero.

The second measurement point 39 in turn has a high-pass filter 43, which is tuned to the second test frequency that is used. The high-pass filter 43 is once again followed by a diode and a capacitor and a resistor connected in parallel with one another. A signal which in this case corresponds to the impedance of the series circuit 44 and of the semiconductor switch 31 at the second test frequency can be tapped off across the resistor. As can be seen from FIG. 4, when the switch is closed, this value will have a value which is dependent on specific characteristics of the individual components and the voltage across the semiconductor switch 31. In this case, the value will be virtually zero when the switch is open.

The two measurement points 38, 39 therefore offer a clear indication as to whether the switch is actually acting as if it were closed, that is to say it is switched on, and the voltage across the semiconductor switch 31 therefore disappears, except for a residual value which is dependent on the specific semiconductor switch 31, and its own capacitance is shorted. It is likewise possible to determine whether the semiconductor switch 31 is actually acting as though it were switched off, that is to say in a blocking form. This test can be carried out continuously, depending on the operating mode of the AC voltage sources 37, 38.

Figure 2:
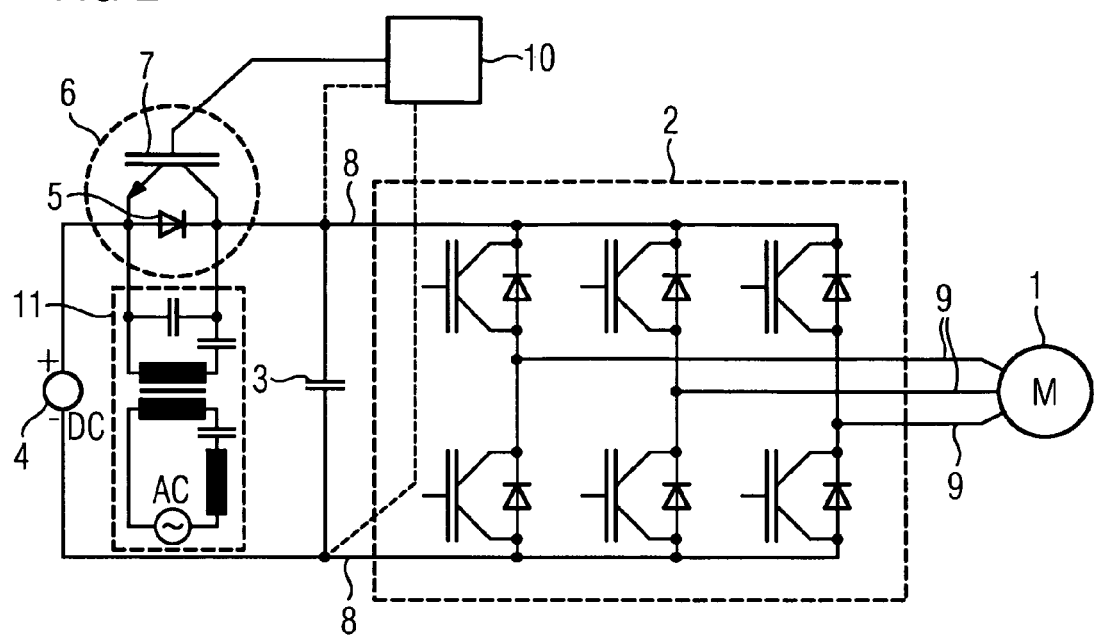
FIG. 2 shows a drive system with a test circuit.

The methods and devices are not restricted to specific types of semiconductor switches 31, but can be used for any semiconductor switch 31, such as MOSFETs, IGBTs, or else for diodes. One specific application will be described in the following text with reference to a second exemplary embodiment and in conjunction with FIG. 2.

A drive system for an electrically driven vehicle, for example an electric car, will be considered in the second exemplary embodiment. The drive system has an electric motor 1 in the form of a permanent-magnet synchronous machine. The electric motor 1 is used in the weak-field mode. Its three phase inputs are connected in a known manner to the output lines 9 from a converter 2. In a conventional form, and on the basis of each of the three output lines 9 of the electric motor 1, the converter 2 has three pairs each comprising a parallel-connected diode and semiconductor switch, which are then joined together in a known manner to form two input lines 8. The two input lines 8 are connected via an intermediate-circuit capacitor 3.

Furthermore, the two input lines 8 lead to the connections of a DC battery 4. A battery protection device 6 is provided between the positive connection of the battery 4 and the converter 2. The battery protection device 6 includes a diode 5 and an IGBT 7 connected in parallel with the diode 5. The diode 5 is in this case used such that it is forward-biased in the direction from the battery 4, and is reverse-biased in the direction from the converter 2 to the battery 4. The IGBT 7 is connected to a controller 10. The controller 10 also has two electrical connections for a voltage measurement. The voltage which is dropped across the intermediate-circuit capacitor 3 can therefore be measured.

Figure 3:
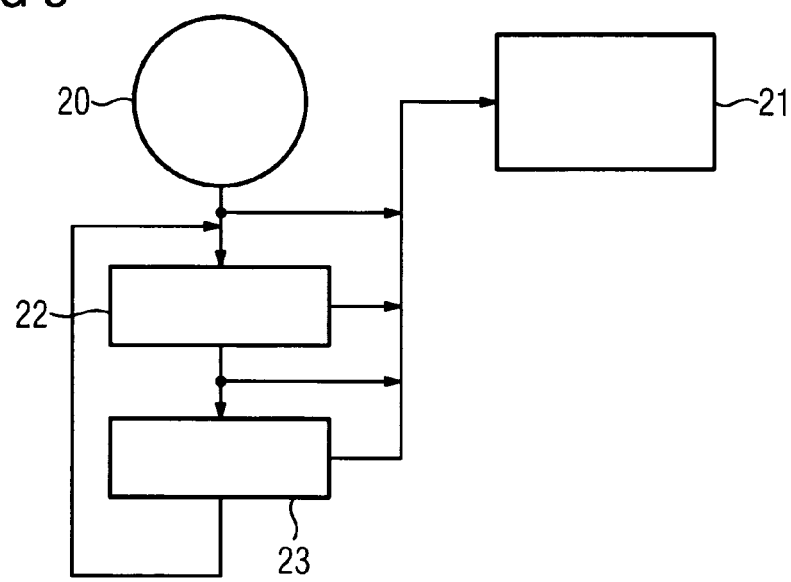
FIG. 3 shows an operating scheme for the drive system.

The operation of the drive system will be explained in the following text with reference to a flowchart which is illustrated in FIG. 3. This is based on the assumption that the electrical vehicle under consideration here is started in a motor starting step 20. In the case of electric motors, this need not necessarily mean that the motors actually run, as in the case of internal combustion engines, and this is intended to mean only the initial point. If the electrical vehicle is ready to be driven, it is in an intermediate state in which no feedback takes place from the motor, and the motor is also not driven either. This state, that is to say no load, also occurs repeatedly later, but this will not be described in any more detail here.

The following text considers two operating states which normally alternate and also occur alternately with the low-load situation that has already been mentioned. After motor start 20, motor operation 22 will normally occur first of all. In this step or operating state, the electric motor 1 is fed from the battery 4, in order to drive the electrical vehicle. The IGBT 7 is switched off during motor operation 22.

When the electrical vehicle is intended to be braked, then the drive system switches to the braking mode 23. In the braking mode 23, feedback then takes place from the electric motor 1 into the battery 4, in order to recharge the battery 4 and thus to recover energy. The converter 2 is then used as a rectifier. Since, in this case, the diode 5 has a blocking effect, the IGBT 7 is switched on during braking operation 23, in order to bridge the diode 5 and to allow feedback.

The controller 10 switches the IGBT 7 on and off. In this case, it measures the voltage dropped across the intermediate-circuit capacitor 3 and uses a voltage threshold value, which is defined in advance, to determine whether the converter 2 is operating correctly. If the converter 2 fails, then the field-weakening current fails and the magnets in the electric motor 1 induce an increased voltage in the output lines 9. If this voltage is passed on via the converter 2 into the input lines 8, then this voltage can lead to damage to the battery 4. However, the controller 10 uses the voltage measurement to determine whether a fault situation 21 such as this has occurred. If the fault situation 21 has occurred, then the controller 10 switches the IGBT 7 off. This in turn prevents current from being passed in the direction of the battery 4, because the diode 5 is reverse-biased. This prevents damage to the battery 4.

For operation of the battery in an electrical vehicle, it is highly advantageous to ensure at all times that the battery protection device 6 has the capability for passing and blocking current. In order to allow this to be tested, a test circuit 11 for the battery protection device 6 is added to the circuit shown in FIG. 2, although this is indicated only in a simplified form in FIG. 2. The test circuit 11 allows continuous or else periodic testing of the actual conductivity state of the battery protection device 6. Since voltages of more than 600 V can occur in particular in the area of the battery protection device 6 in an electrical vehicle, it is particularly advantageous in this case for it to be possible to carry out the test with galvanic isolation being provided by the transformer 33. That part of the test circuit 11 beyond the transformer can thus be operated at a potential close to ground, in particular also the measurement points 39, 40, and an evaluation processor, which may be connected thereto, irrespective of whether this is now provided additionally for the test circuit 11, or some other already existing microprocessor is also used for this purpose.

In the second exemplary embodiment, in order to test the capability of the diode 5 to carry current, it is necessary for the voltage of the battery 4 to be higher than the intermediate-circuit voltage. This is the case during motor operation 22. In contrast, the intermediate-circuit voltage must be higher than the voltage in the battery 4 in order to test the blocking capability. This is the case during braking operation 23, that is to say in the case of feedback into the battery 4. In this case, both the blocking capability and the conductivity of the IGBT 7 can be tested, by switching it off or on.

In order to also allow the blocking capability and conductivity of the IGBT 7 to be tested during motor operation 22, switching briefly takes place to braking operation 23 during motor operation 22, in this exemplary embodiment. In this case, it is expedient not to carry out mechanical braking, but simply to briefly use braking operation 23 in order to produce a voltage which is above the voltage of the battery 4, in the intermediate circuit. This allows the IGBT 7 to be tested during the short time during which switching takes place to braking operation 23. In this case, the duration of switching to braking operation 23 is expediently designed on the one hand to allow the IGBT 7 to be tested and on the other hand to ensure, by virtue of the inertia of the mechanical components of the electrical vehicle, that no significant effects can be expected for the driver of the vehicle.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A method for testing a switch, comprising:
   connecting the switch to an electrical test circuit which has a transformer;
   producing an AC voltage in the test circuit;
   determining an impedance of the test circuit and the switch for the AC voltage;
   selecting a conductivity state of the switch to be tested, the conductivity state being selected from first and second conductivity states, the first conductivity state representing the switch being switched-on, and the second conductivity state representing the switch being switched-off; and
   selecting a frequency for the AC voltage, which is matched to the conductivity state to be tested, wherein the frequency is selected such that when the switch is in at least one of the first and second conductivity states, the impedance determined should be virtually zero.

2. The method as claimed in claim 1, wherein first and second AC voltages are produced in the test circuit to test the first and second conductivity states, respectively.

3. A test circuit for functional testing of a switch, comprising:
   a transformer;
   a feed circuit to produce an AC voltage at a testing frequency; and
   at least one measurement circuit to determine an impedance of the test circuit and the switch at the testing frequency,
   to select a conductivity state of the switch to be tested, the conductivity state being selected from first and second conductivity states, the first conductivity state representing the switch being switched-on, and the second conductivity state representing the switch being switched-off, and to select a frequency for the AC voltage, which is matched to the conductivity state to be tested, wherein the frequency is selected such that when the switch is in at least one of the first and second conductivity states, the impedance determined should be virtually zero.

4. The test circuit as claimed in claim 3, wherein
   the transformer has primary and secondary coils,
   the feed circuit is connected to the secondary coil of the transformer, and
   the primary coil of the transformer is connected in parallel with the switch.

5. The test circuit as claimed in claim 3, further comprising:
   a series capacitor and a series inductance connected in series with the transformer.

6. The test circuit as claimed in claim 4, further comprising:
   a series capacitor and a series inductance connected in series with the transformer.

7. An electrical circuit comprising:
   at least one switch; and
   a test circuit comprising:
      a transformer;
      a feed circuit to produce an AC voltage at a testing frequency; and
      at least one measurement circuit to determine an impedance of the test circuit and the component at the testing frequency,
   to select a conductivity state of the switch to be tested, the conductivity state being selected from first and second conductivity states, the first conductivity state representing the at least one switch being switched-on, and the second conductivity state representing the at least one switch being switched-off, and to select a frequency for the AC voltage, which is matched to the conductivity state to be tested, wherein the frequency is selected such that when the switch is in at least one of the first and second conductivity states, the impedance determined should be virtually zero.

8. The electrical circuit as claimed in claim 7, wherein the component is a semiconductor component.

9. A converter circuit having overvoltage protection, comprising:
   a converter to convert a single-phase voltage to a three-phase voltage;
   a diode, which is provided on a single-phase side of the converter;
   a semiconductor switch that includes a diode, the semiconductor switch being provided on a single-phase side of the converter;
   a single-phase battery, which is connected to the single-phase side of the converter; and
   a test circuit comprising:
      a transformer;
      a feed circuit to produce an AC voltage at a testing frequency; and
      at least one measurement circuit to determine an impedance of the semiconductor switch at the testing frequency.

10. The converter circuit as claimed in claim 9, wherein the semiconductor switch is an insulated gate bipolar transistor (IGBT).

* * * * *